United States Patent
Liu et al.

(10) Patent No.: US 12,308,840 B2
(45) Date of Patent: May 20, 2025

(54) RELAXATION OSCILLATOR

(71) Applicant: FARADAY TECHNOLOGY CORPORATION, Hsinchu (TW)

(72) Inventors: Hao-Wei Liu, Hsinchu (TW); Yueh-Hua Yu, Hsinchu (TW); Hong-Ren Lin, Hsinchu (TW)

(73) Assignee: FARADAY TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 18/395,790

(22) Filed: Dec. 26, 2023

(65) Prior Publication Data
US 2024/0339991 A1 Oct. 10, 2024

(30) Foreign Application Priority Data
Apr. 6, 2023 (TW) ................... 112112866

(51) Int. Cl.
  *H03K 3/0231* (2006.01)
  *H03K 3/014* (2006.01)
  *H03K 3/354* (2006.01)

(52) U.S. Cl.
  CPC ........... *H03K 3/0231* (2013.01); *H03K 3/014* (2013.01); *H03K 3/354* (2013.01)

(58) Field of Classification Search
  CPC ........ H03K 3/0231; H03K 3/354; H03K 4/50; H03K 4/52; H03K 4/501; H03K 4/502; H03K 3/014; H03B 5/24; H03L 3/00
  See application file for complete search history.

(56) References Cited

U.S. PATENT DOCUMENTS

| | | | |
|---|---|---|---|
| 2005/0253661 A1* | 11/2005 | Lee | H03K 3/0231 331/185 |
| 2006/0097813 A1* | 5/2006 | Won | H03L 1/00 331/185 |
| 2014/0354364 A1* | 12/2014 | Muller | H03K 3/0231 331/18 |

FOREIGN PATENT DOCUMENTS

WO    WO-2009070940 A1 *   6/2009   ........... H03K 3/0231

OTHER PUBLICATIONS

H. Asano et al., "A Fully Integrated, 1-µs Start-up Time, 32-MHz Relaxation Oscillator for Low-Power Intermittent Systems", Added to IEEE Xplore: Oct. 24, 2016.

* cited by examiner

*Primary Examiner* — Ryan Johnson
(74) *Attorney, Agent, or Firm* — WPAT, PC

(57) ABSTRACT

A relaxation oscillator includes a start-up circuit. During the start-up period of the relaxation oscillator, two output signals from the relaxation oscillator are controlled to be complementary signals by the start-up circuit according to a control signal. Consequently, the relaxation oscillator can be started up successfully. The relaxation oscillator can generate periodic square wave signals. Moreover, during the start-up period of the relaxation oscillator, the generation of the deadlock situation can be avoided.

12 Claims, 7 Drawing Sheets

RELAXATION OSCILLATOR

This application claims the benefit of Taiwan Patent Application No. 112112866, filed Apr. 6, 2023, the subject matter of which is incorporated herein by reference.

FIELD OF THE INVENTION

The present invention relates to an oscillating circuit, and more particularly to a relaxation oscillator.

BACKGROUND OF THE INVENTION

As known, a relaxation oscillator is an oscillating circuit for generating a non-sinusoidal periodic signal. For example, the non-sinusoidal periodic signal is a square wave signal or a sawtooth signal.

FIG. 1A is a schematic circuit diagram illustrating the circuitry structure of a conventional relaxation oscillator. FIG. 1B is a schematic timing waveform diagram illustrating associated signals of the conventional relaxation oscillator.

The relaxation oscillator 100 comprises an operational amplifier 110, a capacitor C, and three resistors r1, r2 and r3. The operational amplifier 110 is connected with two voltage sources. Consequently, the operational amplifier 110 receives a first supply voltage Vdd and a second supply voltage −Vss from the two voltage sources, respectively. The first supply voltage Vdd is a positive voltage. The second supply voltage −Vss is a negative voltage.

The resistor r1 is connected between a negative input terminal of the operational amplifier 110 and an output terminal of the operational amplifier 110. The capacitor C is connected between the negative input terminal of the operational amplifier 110 and a ground terminal GND. The resistor r2 is connected between a positive input terminal of the operational amplifier 110 and the output terminal of the operational amplifier 110. The resistor r3 is connected between the positive input terminal of the operational amplifier 110 and the ground terminal GND. The voltage at the negative input terminal of the operational amplifier 110 is V−. The voltage at the positive input terminal of the operational amplifier 110 is V+. The voltage at the output terminal of the operational amplifier 110 is Vo. The voltage Vc of the capacitor C is equal to the voltage at the negative input terminal of the operational amplifier 110. That is Vc=V−.

Please refer to FIGS. 1A and 1B. The resistor r2 and the resistor r3 are collaboratively formed as a voltage divider. It is assumed that $[r3/(r2+r3)]=\beta$, wherein $\beta$ is greater than zero, and $\beta$ is less than 1. Consequently, the relationship between the voltage V+ at the positive input terminal of the operational amplifier 110 and the voltage Vo at the output terminal of the operational amplifier 110 may be expressed as: $V+=\beta\times Vo$. Consequently, if the voltage Vo at the output terminal is the first supply voltage Vdd, the voltage V+ at the positive input terminal of the operational amplifier 110 may be expressed as $V+=\beta\times Vdd$. Moreover, if the voltage Vo at the output terminal of the operational amplifier 110 is the second supply voltage −Vss, the voltage V+ at the positive input terminal of the operational amplifier 110 may be expressed as $V+=-\beta\times Vss$.

Please refer to FIG. 1B. At the time point t1, the voltage V− at the negative input terminal of the operational amplifier 110 is lower than the voltage V+ at the positive input terminal of the operational amplifier 110. In addition, the voltage Vo at the output terminal of the operational amplifier 110 is switched from the second supply voltage −Vss to the first supply voltage Vdd, and the voltage V+ at the positive input terminal of the operational amplifier 110 is switched to $(\beta\times Vdd)$. Meanwhile, the capacitor C starts to be charged from $(-\beta\times Vss)$.

At the time point t2, the capacitor C is charged to $(\beta\times Vdd)$. Consequently, the voltage V− at the negative input terminal of the operational amplifier 110 is higher than the voltage V+ at the positive input terminal of the operational amplifier 110. In addition, the voltage Vo at the output terminal of the operational amplifier 110 is switched from the first supply voltage Vdd to the second supply voltage −Vss, and the voltage V+ at the positive input terminal of the operational amplifier 110 is switched to $(-\beta\times Vss)$. Meanwhile, the capacitor C starts to be discharged from $(\beta\times Vdd)$.

Similarly, at the time point t3, the voltage Vo at the output terminal of the operational amplifier 110 is switched from the second supply voltage −Vss to the first supply voltage Vdd. Meanwhile, the capacitor C starts to be charged from $(-\beta\times Vss)$.

Similarly, at the time point t4, the voltage Vo at the output terminal of the operational amplifier 110 is switched from the first supply voltage Vdd to the second supply voltage −Vss. Meanwhile, the capacitor C starts to be discharged from $(\beta\times Vdd)$.

The rest may be deduced by analogy. The voltage Vo at the output terminal of the operational amplifier 110 is alternately switched between the first supply voltage Vdd and the second supply voltage −Vss. Consequently, in the relaxation oscillator 100, the output terminal of the operational amplifier 110 can generate a periodic square wave signal.

SUMMARY OF THE INVENTION

An embodiment of the present invention provides a relaxation oscillator. The relaxation oscillator includes a voltage-controlled current circuit, a first transistor, a second transistor, a third transistor, a fourth transistor, a first capacitor, a second capacitor, a latching circuit, a combinational logic circuit, a fifth transistor, a sixth transistor, a seventh transistor and an eighth transistor. The voltage-controlled current circuit receives a first supply voltage. The voltage-controlled current circuit includes a first current path, a second current path, a third current path and a fourth current path. The first current path is coupled to a first node. The second current path is coupled to a second node. The third current path is coupled to a third node. The fourth current path is coupled to a fourth node. A voltage at the second node is a first output signal of the relaxation oscillator. A first drain/source terminal of the first transistor is connected with the second node. A second drain/source terminal of the first transistor is connected with a fifth node. A gate terminal of the first transistor is connected with the first node. A first drain/source terminal of the second transistor is connected with the third node. A second drain/source terminal of the second transistor is connected with the fifth node. A gate terminal of the second transistor is connected with the fourth node. A first drain/source terminal of the third transistor is connected with the first node. A second drain/source terminal of the third transistor is connected with the fifth node. A gate terminal of the third transistor is connected with the third node. A first drain/source terminal of the fourth transistor is connected with the fourth node. A second drain/source terminal of the fourth transistor is connected with the fifth node. A gate terminal of the fourth transistor is connected with the second node. A first capacitor is connected between the first node and the fifth node. A second capacitor is connected between the first node and the fifth node. The fifth node receives a second supply voltage. A first terminal of the latching circuit is connected with the second node. A second terminal of the latching circuit is connected with the third node. A third terminal of the latching circuit is connected with the fifth node. A combinational logic circuit receives a control signal and generates a first signal and a second signal. A first drain/source terminal of the fifth transistor is connected with the second node. A second drain/source terminal of the fifth transistor is connected with the fifth node. A gate terminal of the fifth transistor receives the second signal. A first drain/source terminal of the sixth transistor is connected with the third node. A second drain/source terminal of the sixth transistor is connected with the fifth node. A gate terminal of the sixth transistor receives the first signal. A first drain/source terminal of the seventh transistor is connected with the first node. A second drain/source terminal of the seventh transistor is connected with the fifth node. A gate terminal of the seventh transistor receives the second signal. A first drain/source terminal of the eighth transistor is connected with the fourth node. A second drain/source terminal of the eighth transistor is connected with the fifth node. A gate terminal of the eighth transistor receives the second signal. When the control signal is inactivated, the relaxation oscillator is not in the normal working mode. When the control signal is activated, the relaxation oscillator is in the normal working mode.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
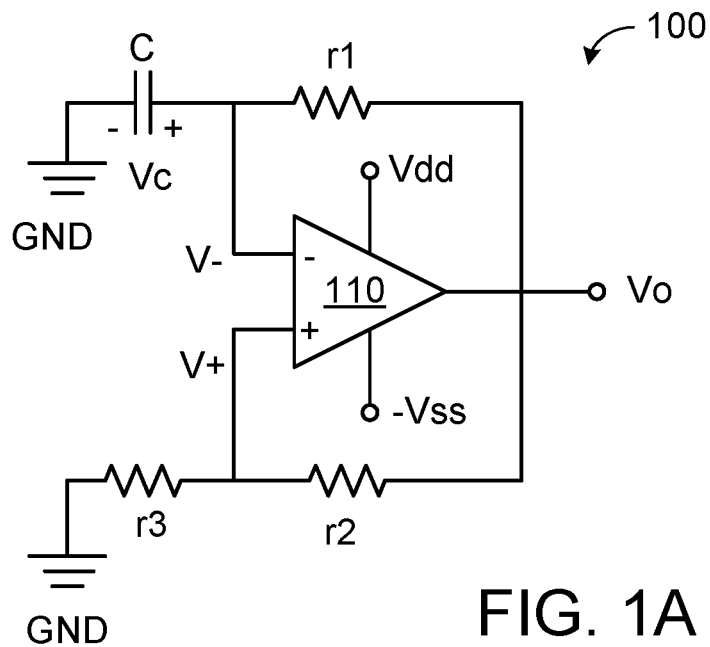
FIG. 1A (prior art) is a schematic circuit diagram illustrating the circuitry structure of a conventional relaxation oscillator.
Figure 1B:
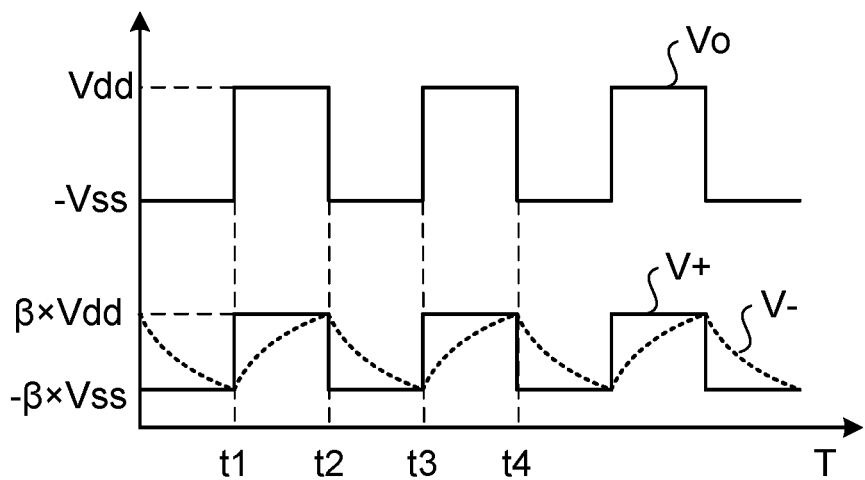
FIG. 1B (prior art) is a schematic timing waveform diagram illustrating associated signals of the conventional relaxation oscillator.
Figure 2A:
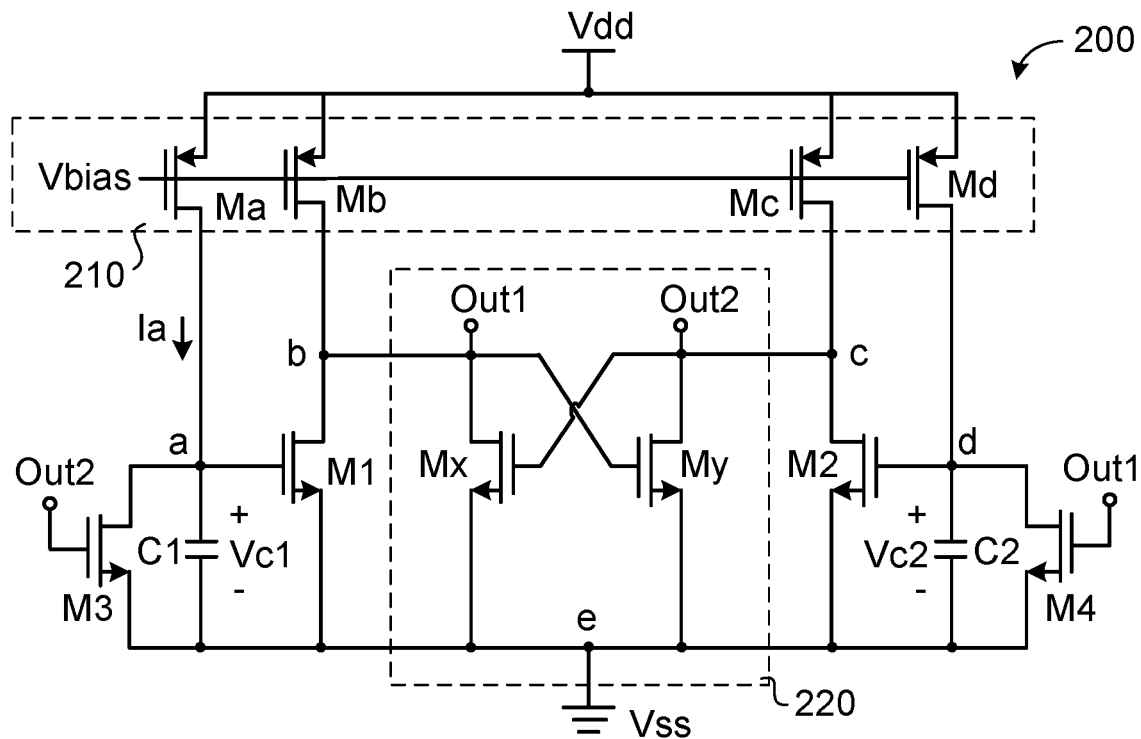
FIG. 2A is a schematic circuit diagram illustrating the circuitry structure of a relaxation oscillator according to a first embodiment of the present invention.

The present invention provides a relaxation oscillator with a novel circuitry structure. FIG. 2A is a schematic circuit diagram illustrating the circuitry structure of a relaxation oscillator according to a first embodiment of the present invention. As shown in FIG. 2A, the relaxation oscillator 200 comprises a voltage-controlled current circuit 210, a latching circuit 220, plural transistors M1~M4, and plural capacitors C1 and C2. The transistors M1~M4 are n-type transistors.

The voltage-controlled current circuit 210 receives a first supply voltage Vdd. For example, the first supply voltage Vdd is 5V. The voltage-controlled current circuit 210 comprises four current paths. The first current path is coupled to a node a. The second current path is coupled to a node b. The third current path is coupled to a node c. The fourth current path is coupled to a node d. In the relaxation oscillator 200 of the first embodiment, the four current paths are directly connected to the corresponding nodes. It is noted that numerous modifications and alterations may be made while retaining the teachings of the invention. For example, in some other embodiments, the four current paths are coupled to the corresponding nodes via other elements.

The first drain/source terminal of the transistor M1 is connected with the node b. The second drain/source terminal of the transistor M1 is connected with a node e. The gate terminal of the transistor M1 is connected with the node a. The first drain/source terminal of the transistor M2 is connected with the node c. The second drain/source terminal of the transistor M2 is connected with the node e. The gate terminal of the transistor M2 is connected with the node d. The first drain/source terminal of the transistor M3 is connected with the node a. The second drain/source terminal of the transistor is connected with the node e. The gate terminal of the transistor M3 is connected with the node c. The first drain/source terminal of the transistor M4 is connected with the node d. The second drain/source terminal of the transistor M4 is connected with the node e. The gate terminal of the transistor M4 is connected with the node b.

In this embodiment, the voltage at the node b is used as a first output signal Out1 of the relaxation oscillator 200, and the voltage at the node c is used as a second output signal Out2 of the relaxation oscillator 200. It is noted that numerous modifications and alterations may be made while retaining the teachings of the invention. For example, in some other embodiments, the relaxation oscillator 200 has a single output signal only. That is, the voltage at the node b or the voltage at the node c is used as the output signal.

The capacitor C1 is connected between the node a and the node e. The voltage difference between the node a and the node e is the voltage Vc1 of the capacitor C1. The capacitor C2 is connected between the node d and the node e. The voltage difference between the node d and the node e is the voltage Vc2 of the capacitor C2. Moreover, the node e receives the second supply voltage Vss. For example, the second supply voltage Vss is a ground voltage (0V).

The voltage-controlled current circuit 210 comprises plural transistors Ma~Md. In addition, the transistors Ma~Md are p-type transistors. The first drain/source terminal of the transistor Ma receives the first supply voltage Vdd. The second drain/source terminal of the transistor Ma is connected with the first current path. The gate terminal of the transistor Ma receives a bias voltage Vbias. The first drain/source terminal of the transistor Mb receives the first supply voltage Vdd. The second drain/source terminal of the transistor Mb is connected with the second current path. The gate terminal of the transistor Mb receives the bias voltage Vbias. The first drain/source terminal of the transistor Mc receives the first supply voltage Vdd. The second drain/source terminal of the transistor Mc is connected with the third current path. The gate terminal of the transistor Mc receives the bias voltage Vbias. The first drain/source terminal of the transistor Md receives the first supply voltage Vdd. The second drain/source terminal of the transistor Md is connected with the fourth current path. The gate terminal of the transistor Md receives the bias voltage Vbias.

According to the bias voltage Vbias, the magnitudes of the currents outputted from the four current paths can be adjusted by the voltage-controlled current circuit 210. In addition, the magnitudes of the currents outputted from the four current paths are in proportion to the sizes of the corresponding transistors M1~M4, respectively. For example, the transistors Ma~Md have the same size. In case that the current Ia is outputted from the first output path according to the bias voltage Vbias, the magnitude of each of the currents outputted from the second, third and fourth current path is equal to the magnitude of the current Ia.

The latching circuit 220 comprises two transistors Mx and My. The transistors Mx and My are n-type transistors. The first drain/source terminal of the transistor Mx is connected with the node b. The second drain/source terminal of the transistor Mx is connected with the node e. The gate terminal of the transistor Mx is connected with the node c. The first drain/source terminal of the transistor My is connected with the node c. The second drain/source terminal of the transistor My is connected with the node e. The gate terminal of the transistor My is connected with the node b.

In case that the first output signal Out1 is in a high voltage level state Hi and the second output signal Out2 is in a low voltage level state Lo, it is regarded that the latching circuit 220 is in a first state. Whereas, in case that the first output signal Ou1 is in the low voltage level state Lo and the second output signal Out2 is in the high voltage level state Hi, it is regarded that the latching circuit 220 is in a second state. For example, the voltage level in the high voltage level state Hi is the first supply voltage Vdd, and the voltage level in the low voltage level state Lo is the second supply voltage Vss.

Figure 2B:
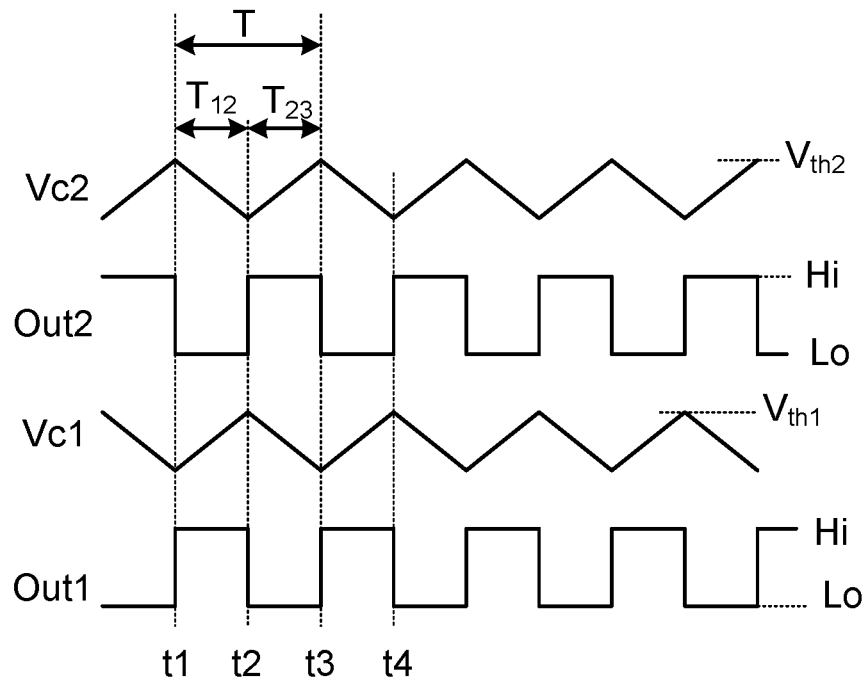
FIG. 2B is a schematic timing waveform diagram illustrating associated signals of the relaxation oscillator as shown in FIG. 2A and in a normal working mode.

FIG. 2B is a schematic timing waveform diagram illustrating associated signals of the relaxation oscillator as shown in FIG. 2A and in a normal working mode.

At the time point t1, the voltage Vc2 of the capacitor C2 is charged to $V_{th2}$, wherein $V_{th2}$ is a threshold voltage of the transistor M2. Consequently, the transistor M2 is turned on, the voltage at the node c (i.e., the second output signal Out2) is in the low voltage level state Lo, the transistor Mx is turned off, the voltage at the node b (i.e., the first output signal Out1) is in the high voltage level state Hi, and the transistor My is turned on. Meanwhile, the latching circuit 220 is switched to the first state.

In the time interval between the time point t1 and the time point t2, the first output signal Out1 is in the high voltage level state Hi. Consequently, the transistor M4 is turned on, the capacitor C2 starts to be discharged from $V_{th2}$, and the voltage Vc2 of the capacitor C2 starts to drop. Moreover, since the second output signal Out2 is in the low voltage level state Lo, the transistor M3 is turned off, the capacitor C1 starts to be charged, and the voltage Vc1 of the capacitor C1 starts to rise. Meanwhile, the transistors M1 and M2 are turned off, and the latching circuit 220 is maintained in the first state.

At the time point t2, the voltage Vc1 of the capacitor C1 is charged to $V_{th1}$, wherein $V_{th1}$ is a threshold voltage of the transistor M1. Consequently, the transistor M1 is turned on, the voltage at the node b (i.e., the first output signal Out1) is in the low voltage level state Lo, the transistor My is turned off, the voltage at the node c (i.e., the second output signal Out2) is in the high voltage level state Hi, and the transistor Mx is turned on. Meanwhile, the latching circuit 220 is switched to the second state.

In the time interval between the time point t2 and the time point t3, the first output signal Out1 is in the low voltage level state Lo. Consequently, the transistor M4 is turned off, the capacitor C2 starts to be charged, and the voltage Vc2 of the capacitor C2 starts to rise. Moreover, since the second output signal Out2 is in the high voltage level state Hi, the transistor M1 is turned on, the capacitor C1 starts to be discharged from the $V_{th1}$, and the voltage Vc1 of the capacitor C1 starts to drop. Meanwhile, the transistors M1 and M2 are turned off, and the latching circuit 220 is maintained in the second state.

Similarly, at the time point t3, the voltage Vc2 of the capacitor C2 is charged to $V_{th2}$. Consequently, the transistor M2 is turned on, the transistor My is turned on, the voltage at the node c (i.e., the second output signal Out2) is in the low voltage level state Lo, the transistor Mx is turned off, and the voltage at the node b (i.e., the first output signal Out1) is in the high voltage level state Hi. Meanwhile, the latching circuit 220 is switched to the first state.

Similarly, at the time point t4, the voltage Vc1 of the capacitor C1 is charged to $V_{th1}$. Consequently, the transistor M1 is turned on, the transistor My is turned off, the voltage at the node c (i.e., the second output signal Out2) is in the high voltage level state Hi, the transistor Mx is turned on, and the voltage at the node b (i.e., the first output signal Out1) is in the low voltage level state Lo. Meanwhile, the latching circuit 220 is switched to the second state. The rest may be deduced by analogy.

Consequently, the first output signal Out1 and the second output signal Out2 outputted from the relaxation oscillator 200 are complementary to each other. In addition, the first output signal Out1 and the second output signal Out2 are periodic square wave signals.

Figure 2C:
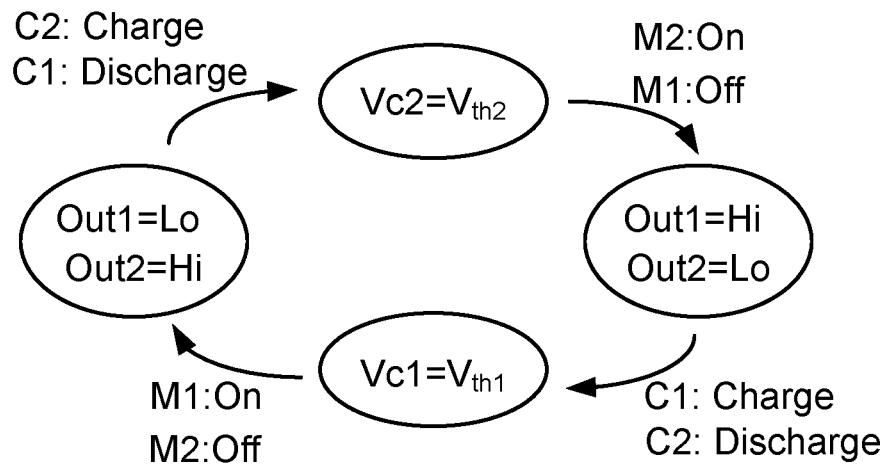
FIG. 2C is a state diagram of the relaxation oscillator as shown in FIG. 2A and in a normal working mode.

FIG. 2C is a state diagram of the relaxation oscillator as shown in FIG. 2A and in a normal working mode.

In the first state of the latching circuit 220, the first output signal Out1 is in the high voltage level state Hi, and the second output signal Out2 is in the low voltage level state Lo. Then, the capacitor C1 starts to be charged, and the capacitor C2 starts to be discharged. Consequently, the transistors M1 and M2 are turned off.

When the voltage Vc1 of the capacitor C1 is charged to $V_{th1}$, the transistor M1 is turned on, and the transistor M2 is maintained in the off state. Meanwhile, the latching circuit 220 is switched to second state. In the second state, the first output signal Out1 is in the low voltage level state Lo, and the second output signal Out2 is in the high voltage level state Hi. Then, the capacitor C1 starts to be discharged, and the capacitor C2 starts to be charged. Consequently, the transistors M1 and M2 are turned off.

When the voltage Vc2 of the capacitor C2 is charged to $V_{th2}$, the transistor M2 is turned on, and the transistor M1 is maintained in the off state. Meanwhile, the latching circuit 220 is switched to the first state. In the first state, the first output signal Out1 is in the high voltage level state Hi, and the second output signal Out2 is in the low voltage level state Lo.

The rest may be deduced by analogy. Consequently, the operation state of the latching circuit 220 is switched between the first state and the second state.

The operation period T of the relaxation oscillator 200 may be determined according to the current Ia of the voltage-controlled current circuit 210, the capacitance of the capacitor C1, the capacitance of the capacitor C2, the threshold voltage $V_{th1}$ of the transistor M1 and the threshold voltage $V_{th2}$ of the transistor M2. For example, in case that the sizes of the transistors Ma~Md in the voltage-controlled current circuit 210 are identical, each of the four current paths generate the current Ia.

In the time interval between the time point t1 and the time point t2 (i.e., $T_{12}$), the accumulated charges Q in the capacitor C1 may be expressed as: $Q=Ia \times T_{12}=c1 \times V_{th1}$. Consequently, $T_{12}=(c1 \times V_{th1})/Ia$. Similarly, $T_{23}=(c2 \times V_{th2})/Ia$. In the above formulae, c1 is the capacitance of the capacitor C1, and the c2 is the capacitance of the capacitor C2. Consequently, the operation period T of the relaxation oscillator 200 may be expressed as: $T=T_{12}+T_{23}$.

However, when the relaxation oscillator 200 of the first embodiment is started up, a deadlock situation may be generated. The reason why the deadlock situation is generated will be described as follows.

Figure 3:
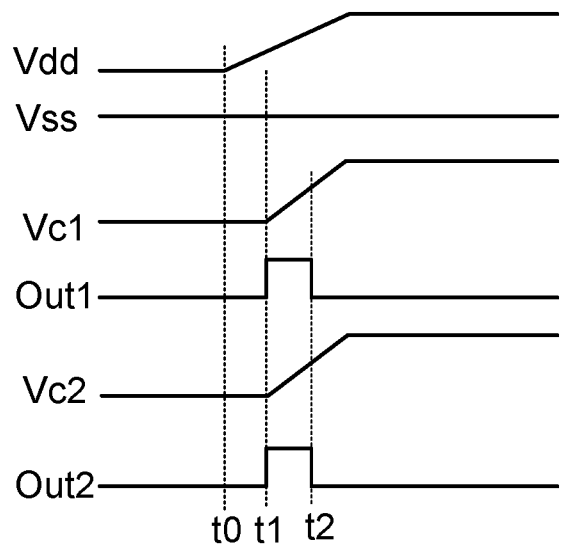
FIG. 3 is a schematic timing waveform diagram illustrating associated signals of the relaxation oscillator of the first embodiment during a start-up period.

FIG. 3 is a schematic timing waveform diagram illustrating associated signals of the relaxation oscillator of the first embodiment during a start-up period.

At the time point t0, the relaxation oscillator 200 receives electric power, and the relaxation oscillator 200 is started up. For example, the first supply voltage Vdd is 5V, and the second supply voltage Vss is the ground voltage (0V). Consequently, after the time point t0, the first power source Vdd gradually rises, and the second supply voltage Vss is maintained in the ground voltage (0V).

At the time point t1, the voltage Vc1 of the capacitor C1 and the voltage Vc2 of the capacitor C2 start to rise simultaneously. Since the voltage Vc1 of the capacitor C1 and the voltage Vc2 of the capacitor C2 are not high enough to turn on the transistors M1 and M2, the first output signal Out1 and the second output signal Out2 may be regraded to be in the high voltage level state.

At the time point t2, both of the transistors M1 and M2 are turned on and both of the transistors Mx and My are turned off according to the voltage Vc1 of the capacitor C1 and the voltage Vc2 of the capacitor C2. Consequently, each of the first output signal Out1 and the second output signal Out2 is switched to the low voltage level state. Meanwhile, the voltage Vc1 of the capacitor C1 and the voltage Vc2 of the capacitor C2 continuously rise. Under this circumstance, each of the first output signal Out1 and the second output signal Out2 is maintained in the low voltage level state. Since the periodic square wave signal cannot be generated, the deadlock situation of the relaxation oscillator 200 occurs.

While the relaxation oscillator 200 of the first embodiment is started up, the voltage Vc1 of the capacitor C1 and the voltage Vc2 of the capacitor C2 rise simultaneously. Consequently, the first output signal Out1 and the second output signal Out2 cannot be formed as the complementary periodic square wave signals. That is, during the start-up period of the relaxation oscillator 200, the deadlock situation is possibly generated. In the deadlock situation, the relaxation oscillator 200 cannot be operated normally.

In order to avoid the generation of the deadlock situation, the relaxation oscillator needs to be modified. For example, the relaxation oscillator is additionally equipped with a start-up circuit composed of electronic components, and the start-up circuit is controlled by a control signal Ctr.

Figure 4A:
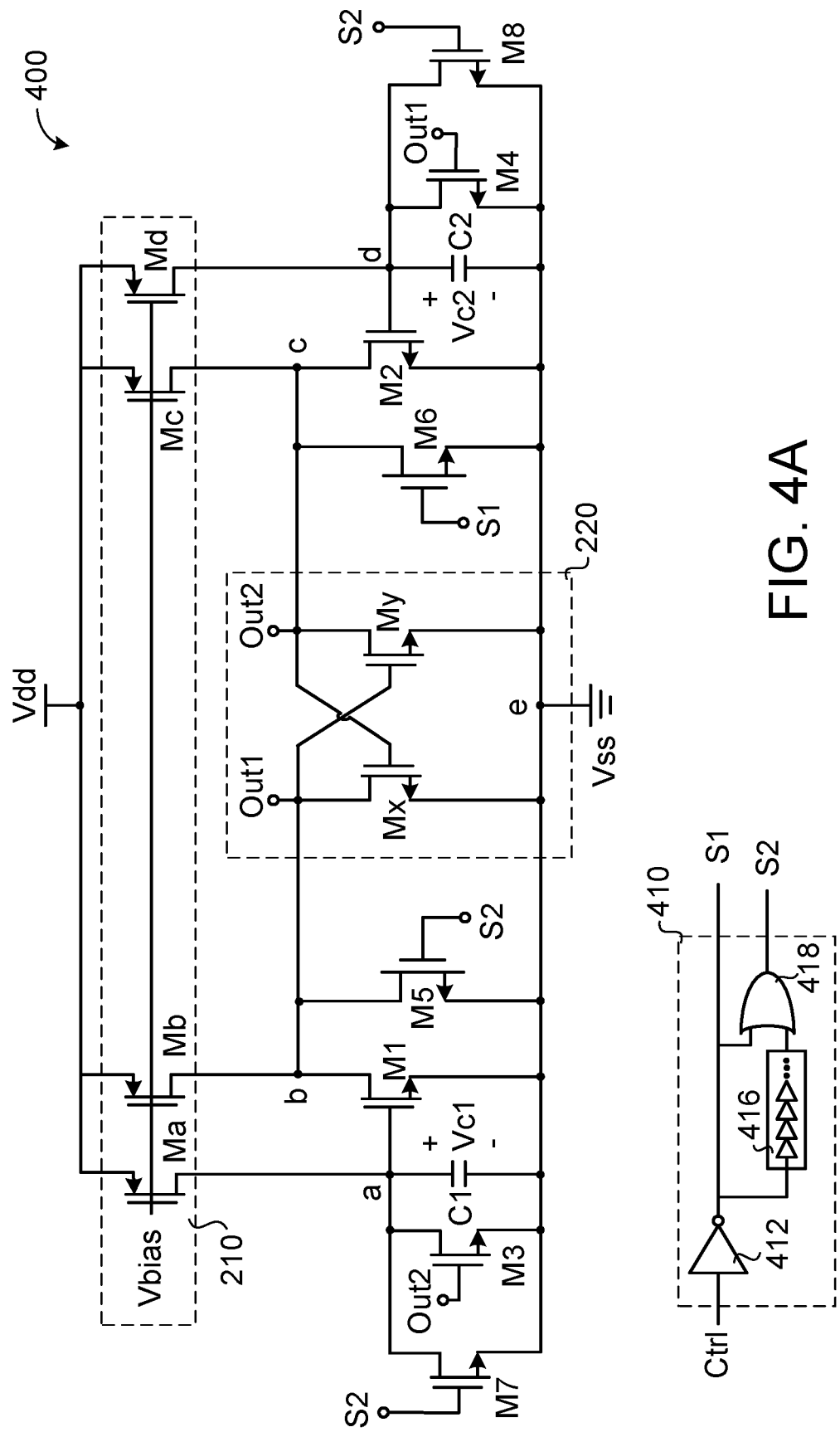
FIG. 4A is a schematic circuit diagram illustrating the circuitry structure of a relaxation oscillator according to a second embodiment of the present invention.

FIG. 4A is a schematic circuit diagram illustrating the circuitry structure of a relaxation oscillator according to a second embodiment of the present invention. In comparison with the relaxation oscillator of the first embodiment, the relaxation oscillator 400 of this embodiment further comprises a combinational logic circuit 410 and plural transistors M5~M8. The transistors M5~M8 are n-type transistors. The circuitry structures of the voltage-controlled current circuit 210 and the latching circuit 220 in the relaxation oscillator 400 of this embodiment are identical to those of the first embodiment, and not redundantly described herein. The connection relationships between the transistors M1~M4, the capacitor C1, the capacitor C2 and associated components are also identical to those of the first embodiment.

The combinational logic circuit 410 comprises a NOT gate 412, a delay element 416 and an OR gate 418. The input terminal of the NOT gate 412 receives the control signal Ctrl. The output terminal of the NOT gate 412 generates a first signal S1. That is, the control signal Ctrl and the first signal S1 are complementary to each other. Moreover, the input terminal of the delay element 416 is connected with the output terminal of the NOT gate 412. The two input terminals of the OR gate 418 are connected with the output terminal of the NOT gate 412 and the output terminal of the delay element 416, respectively. The output terminal of the OR gate 418 generates a second signal S2.

The first drain/source terminal of the transistor M5 is connected with the node b. The second drain/source terminal of the transistor M5 is connected with the node e. The gate terminal of the transistor M5 receives the second signal S2. The first drain/source terminal of the transistor M6 is connected with the node c. The second drain/source terminal of the transistor M6 is connected with the node e. The gate terminal of the transistor M6 receives the first signal S1. The first drain/source terminal of the transistor M7 is connected with the node a. The second drain/source terminal of the transistor M7 is connected with the node e. The gate terminal of the transistor M7 receives the second signal S2. The first drain/source terminal of the transistor M8 is connected with the node d. The second drain/source terminal of the transistor M8 is connected with the node e. The gate terminal of the transistor M8 receives the second signal S2.

Figure 4B:
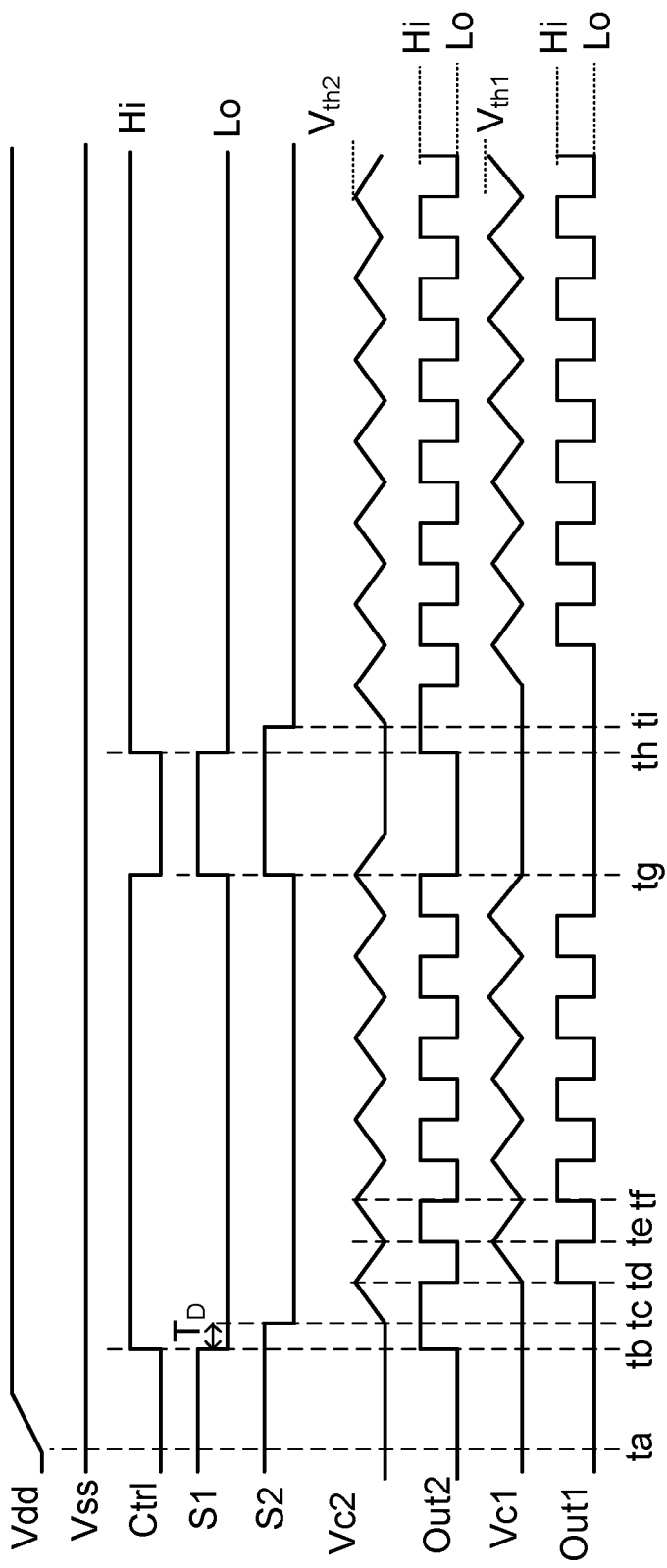
FIG. 4B is a schematic timing waveform diagram illustrating associated signals of the relaxation oscillator according to the second embodiment of the present invention.

FIG. 4B is a schematic timing waveform diagram illustrating associated signals of the relaxation oscillator according to the second embodiment of the present invention.

The relationship between the control signal Ctrl, the first signal S1 and the second signal S2 of the combinational logic circuit 410 will be described as follows.

Before the time point tb, the control signal Ctrl is inactivated, and the control signal Ctrl is in the low voltage level state Lo. At the time point tb, the control signal Ctrl is activated. Consequently, the control signal Ctrl is switched from the low voltage level state Lo to the high voltage level state Hi, and the first signal S1 is switched from the high voltage level state Hi to the low voltage Level state Lo.

The second signal S2 is delayed by the delay element 416 and the OR gate 418. After a delay time $T_D$, i.e., at the time point tc, the second signal S2 is switched from the high voltage level state Hi to the low voltage level state Lo.

At the time point tg, the control signal Ctrl is switched from the high voltage level state Hi to the low voltage level state Lo. In addition, both of the first signal S1 and the second signal S2 are switched from the low voltage level state Lo to the high voltage level state Hi.

When the control signal Ctrl is inactivated, the transistors M5~M8 are turned on according to the first signal S1 and the second signal S2. Consequently, the relaxation oscillator 400 is not in the normal working mode. When the control signal Ctrl is activated, the transistors M5~M8 are turned off according to the first signal S1 and the second signal S2. Consequently, the relaxation oscillator 400 is in the normal working mode. The operations of the combinational logic circuit 410 and the transistors M5~M8 according to the control signal Ctrl will be described in more details as follows.

In this embodiment, the transistor M6 is controlled by the first signal S1, and the transistors M5, M7 and M8 are controlled by the second signal S2. Consequently, at the time point tb, when the control signal Ctrl is activated, the transistor M6 is turned off. After the delay time $T_D$ (i.e., at the time point tc), the transistors M5, M7 and M8 are turned off. That is, after the time point tc, the transistors M5~M8 are turned off. Consequently, the normal operations of the relaxation oscillator 400 are not affected by the transistors M5~M8. Moreover, at the time point tg, the control signal Ctrl is inactivated, and the transistors M5~M8 are turned on simultaneously. Consequently, the relaxation oscillator 400 is disabled.

Please refer to FIG. 4B again. At the time point ta, the relaxation oscillator 400 receives electric power, and the relaxation oscillator 400 is started up. Since the control signal Ctrl is inactivated, the transistors M5~M8 are turned on. In addition, the voltage Vc1 of the capacitor C1, the voltage Vc2 of the capacitor C2, the first output signal Out1 and the second output signal Out2 are maintained in the low voltage level state Lo, and the transistors M1~M4 are turned off. Consequently, the relaxation oscillator 400 cannot be operated normally.

At the time point tb, the control signal Ctrl is activated. Under this circumstance, the transistor M6 is turned off. Consequently, the second output signal Out2 is switched to the high voltage level state Hi. Since the transistors M5, M7 and M8 are still turned on, the voltage Vc1 of the capacitor C1, the voltage Vc2 of the capacitor C2 and the first output signal Out1 are maintained in the low voltage level state Lo.

After the delay time $T_D$ (i.e., at the time point tc), the transistors M5, M7 and M8 are turned off. Meanwhile, since the first output signal Out1 is in the low voltage level state Lo and the second output signal Out2 is in the high voltage level state Hi, the transistor M4 is turned off and the transistor M3 is turned on. Consequently, the capacitor C2 starts to be charged, and the voltage Vc2 of the capacitor C2 starts to rise. The voltage Vc1 of the capacitor C1 is maintained in the low voltage level state.

At the time point td, the voltage Vc2 of the capacitor C2 is charged to $V_{th2}$. Consequently, the transistor M2 is turned on, the voltage at the node c (i.e., the second output signal Out2) is in the low voltage level state Lo, the transistor Mx is turned off, the voltage at the node b (i.e., the first output signal Out1) is in the high voltage level state Hi, and the transistor My is turned on. Meanwhile, the latching circuit 220 is switched to the first state.

In the time interval between the time point td and the time point te, the first output signal Out1 is in the high voltage level state Hi. Consequently, the transistor M4 is turned on, the capacitor C2 starts to be discharged from $V_{th2}$, and the voltage Vc2 of the capacitor C2 starts to drop. Moreover, since the second output signal Out2 is in the low voltage level state Lo, the transistor M3 is turned off, the capacitor C1 starts to be charged, and the voltage Vc1 of the capacitor C1 starts to rise. Meanwhile, the transistors M1 and M2 are turned off, and the latching circuit 220 is maintained in the first state.

At the time point te, the voltage Vc1 of the capacitor C1 is charged to $V_{th1}$. Consequently, the transistor M1 is turned on, the voltage at the node b (i.e., the first output signal Out1) is in the low voltage level state Lo, the transistor My is turned off, the voltage at the node c (i.e., the second output signal Out2) is in the high voltage level state Hi, and the transistor Mx is turned on. Meanwhile, the latching circuit 220 is switched to the second state.

In the time interval between the time point te and the time point tf, the first output signal Out1 is in the low voltage level state Lo. Consequently, the transistor M4 is turned off, the capacitor C2 starts to be charged, and the voltage Vc2 of the capacitor C2 starts to rise. Moreover, since the second output signal Out2 is in the high voltage level state Hi, the transistor M1 is turned on, the capacitor C1 starts to be discharged from the $V_{th1}$, and the voltage Vc1 of the capacitor C1 starts to drop. Meanwhile, the transistors M1 and M2 are turned off, and the latching circuit 220 is maintained in the second state.

Similarly, at the time point tf, the voltage Vc2 of the capacitor C2 is charged to $V_{th2}$. Consequently, the transistor M2 is turned on, the transistor My is turned on, the voltage at the node c (i.e., the second output signal Out2) is in the low voltage level state Lo, the transistor Mx is turned off, and the voltage at the node b (i.e., the first output signal Out1) is in the high voltage level state Hi. Meanwhile, the latching circuit 220 is switched to the first state.

As mentioned above, in the time interval between the time point tb and the time point tc, the first output signal Out1 is controlled to be in the low voltage level state Lo and the second output signal Out2 is controlled to be in the high voltage level state Hi by the relaxation oscillator 400. That is, the first output signal Out1 and the second output signal Out2 are complementary to each other. Consequently, after the time point tc, the relaxation oscillator 400 starts to be operated normally, and the generation of the deadlock situation is avoided.

Moreover, at the time point tg, the control signal Ctrl is inactivated, and the transistors M5~M8 are turned on simultaneously. Consequently, the first output signal Out1 and the second output signal Out2 are switched to the low voltage level state Lo simultaneously. Under this circumstance, the glitch of the first output signal Out1 or the second output signal Out2 will not be generated.

Similarly, at the time point th, the control signal Ctrl is activated again. In the time interval between the time point th and the time point ti, the first output signal Out1 is controlled to be in the low voltage level state Lo and the second output signal Out2 is controlled to be in the high voltage level state Hi by the relaxation oscillator 400. After the time point ti, the relaxation oscillator 400 starts to be operated normally.

As mentioned above, the relaxation oscillator 400 of the present invention is equipped with the combinational logic circuit 410 and the transistors M5~M8. The combinational logic circuit 410 and the transistors M5~M8 are collaboratively formed as a start-up circuit. Consequently, during the start-up period of the relaxation oscillator 400, the generation of the deadlock situation is avoided.

Figure 5:
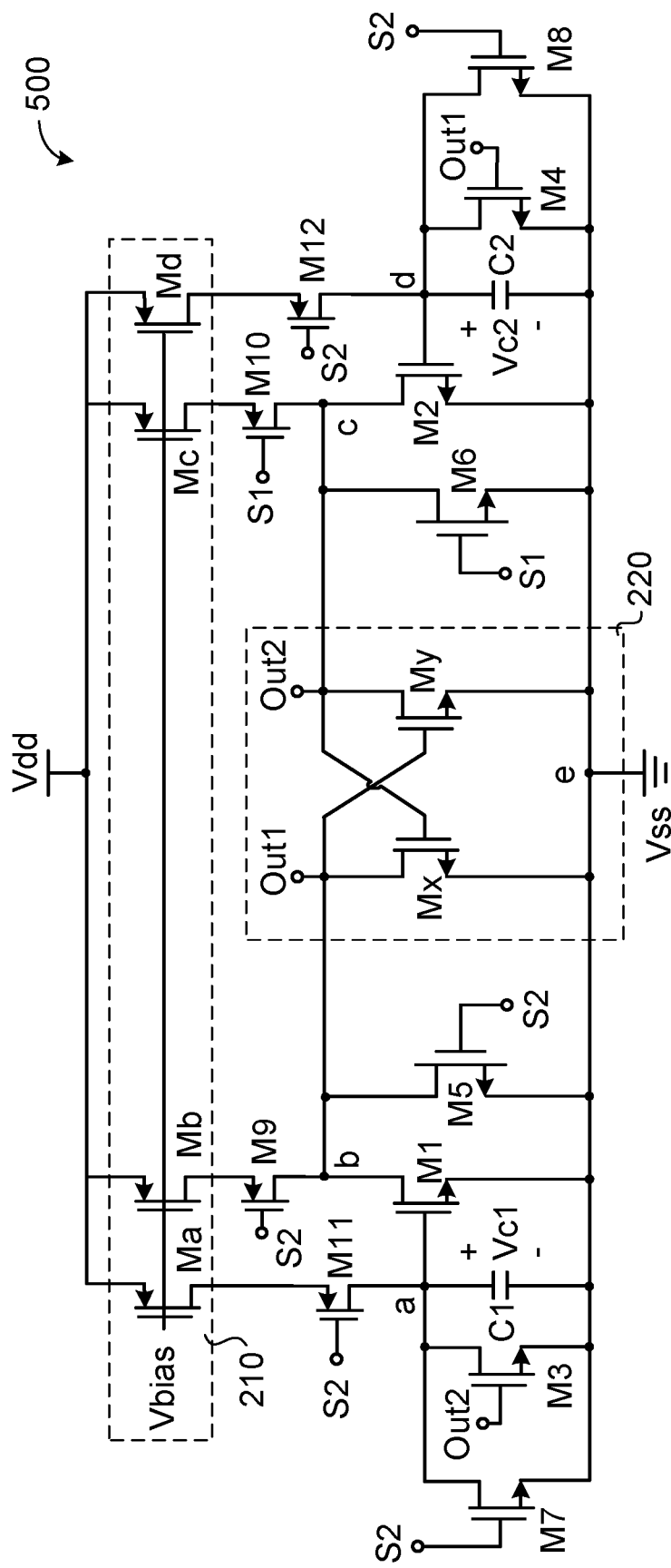
FIG. 5 is a schematic circuit diagram illustrating the circuitry structure of a relaxation oscillator according to a third embodiment of the present invention.

FIG. 5 is a schematic circuit diagram illustrating the circuitry structure of a relaxation oscillator according to a third embodiment of the present invention. In comparison with the relaxation oscillator 400 of the second embodiment, the relaxation oscillator 500 of the third embodiment further comprises transistors M9~M11. The transistor M11 is coupled to the node a through the first current path. The transistor M9 is coupled to the node b through the second current path. The transistor M10 is coupled to the node c through the third current path. The transistor M12 is coupled to the node d through the fourth current path.

The first drain/source terminal of the transistor M11 is connected with the first current path. The second drain/source terminal of the transistor M11 is connected with the node a. The gate terminal of the transistor M11 receives the second signal S2. The first drain/source terminal of the transistor M9 is connected with the second current path. The second drain/source terminal of the transistor M9 is connected with the node b. The gate terminal of the transistor M11 receives the second signal S2. The first drain/source terminal of the transistor M10 is connected with the third current path. The second drain/source terminal of the transistor M10 is connected with the node c. The gate terminal of the transistor M10 receives the first signal S1. The first drain/source terminal of the transistor M12 is connected with the fourth current path. The second drain/source terminal of the transistor M12 is connected with the node d. The gate terminal of the transistor M12 is connected with the second signal S2.

The transistors M9~M12 are p-type transistors. Consequently, when the control signal Ctrl is activated, the transistor M10 is turned on, and the transistors M9, M11 and M12 are turned off. After the control signal Ctrl has been activated for a delay time, the transistors M9~M12 are turned on. When the control signal Ctrl is inactivated, the transistors M9~M12 are turned off.

That is, before the relaxation oscillator 500 is operated normally, the transistor M11 is turned off according to the second signal S2. Consequently, no leakage current is generated in the first current path. The transistor M9 is turned off according to the second signal S2. Consequently, no leakage current is generated in the second current path. The transistor M10 is turned off according to the first signal S1. Consequently, no leakage current is generated in the third current path. The transistor M12 is turned off according to the second signal S2. Consequently, no leakage current is generated in the fourth current path. Moreover, when the relaxation oscillator 500 is operated normally, the transistors M9~M12 are turned on.

As mentioned above, the relaxation oscillator 500 of the third embodiment is additionally equipped with the transistors M9~M12. Consequently, the generation of the leakage current by the relaxation oscillator 500 will be avoided. The operations of the relaxation oscillator 500 of the third embodiment before the normal working mode and after the normal working mode are similar to the operations of the relaxation oscillator 400 of the second embodiment, and not redundantly described herein.

Moreover, the circuitry structures of the voltage-controlled current circuit 210 and the latching circuit 220 are not restricted. The voltage-controlled current circuit 210 and the latching circuit 220 with other circuitry structures can be applied to the relaxation oscillators 200, 400 and 500 of the present invention.

Figure 6:
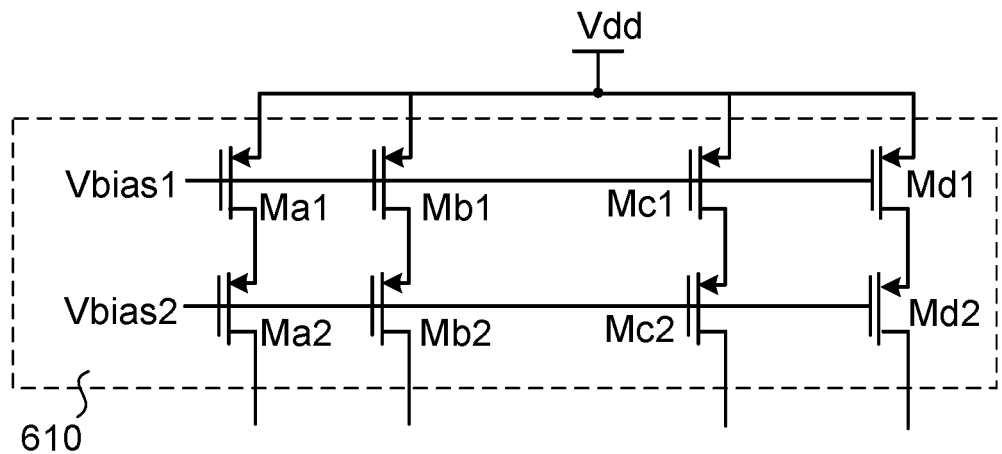
FIG. 6 is a schematic circuit diagram illustrating a variant example of the voltage-controlled current circuit in the relaxation oscillator of the present invention.

FIG. 6 is a schematic circuit diagram illustrating a variant example of the voltage-controlled current circuit in the relaxation oscillator of the present invention. In this embodiment, the voltage-controlled current circuit 610 comprises transistors Ma1~Md1 and Ma2~Md2. The transistors Ma1~Md1 and Ma2~Md2 are p-type transistors.

The first drain/source terminal of the transistor Ma1 receives a first supply voltage Vdd. The gate terminal of the transistor Ma1 receives the first bias voltage Vbias1. The first drain/source terminal of the transistor Mb1 receives the first supply voltage Vdd. The gate terminal of the transistor Mb1 receives the first bias voltage Vbias1. The first drain/source terminal of the transistor Mc1 receives the first supply voltage Vdd. The gate terminal of the transistor Mc1 receives the first bias voltage Vbias1. The first drain/source terminal of the transistor Md1 receives the first supply voltage Vdd. The gate terminal of the transistor Md1 receives the first bias voltage Vbias1.

The first drain/source terminal of the transistor Ma2 is connected with the second drain/source terminal of the transistor Ma1. The second drain/source terminal of the transistor Ma2 is the first current path. The gate terminal of the transistor Ma2 receives a second bias voltage Vbias2. The first drain/source terminal of the transistor Mb2 is connected with the second drain/source terminal of the transistor Mb1. The second drain/source terminal of the transistor Mb2 is the second current path. The gate terminal of the transistor Mb2 receives the second bias voltage Vbias2. The first drain/source terminal of the transistor Mc2 is connected with the second drain/source terminal of the transistor Mc1. The second drain/source terminal of the transistor Mc2 is the third current path. The gate terminal of the transistor Mc2 receives the second bias voltage Vbias2. The first drain/source terminal of the transistor Md2 is connected with the second drain/source terminal of the transistor Md1. The second drain/source terminal of the transistor Md2 is the fourth current path. The gate terminal of the transistor Md2 receives the second bias voltage Vbias2.

By providing the first bias voltage Vbias1 and the second bias voltage Vbias2, the currents in the first current path, the second current path, the third current path and the fourth current path flow to the node a, the node b, the node c and the node d, respectively. In an embodiment, the first current path, the second current path, the third current path and the fourth current path are respectively and directly connected to the node a, the node b, the node c and the node d. Alternatively, in some other embodiments, the first current path, the second current path, the third current path and the fourth current path are coupled to the node a, the node b, the node c and the node d through the transistors M9~M12, respectively.

Figure 7A:
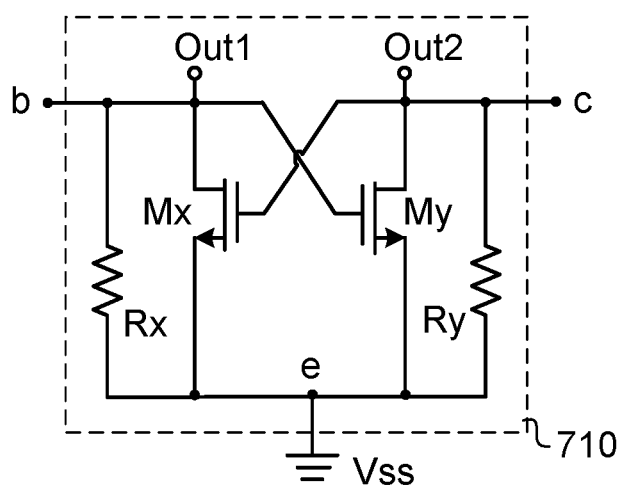
FIGS. 7A and 7B are schematic circuit diagrams illustrating two examples of the latching circuit in the relaxation oscillator of the present invention.
Figure 7B:
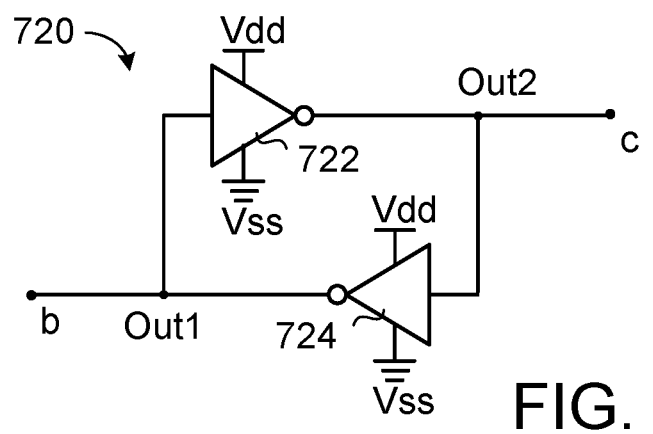

FIGS. 7A and 7B are schematic circuit diagrams illustrating two examples of the latching circuit in the relaxation oscillator of the present invention.

As shown in FIG. 7A, the latching circuit 710 comprises two transistors Mx and My and two resistors Rx and Ry. The first drain/source terminal of the transistor Mx is connected with the node b. The second drain/source terminal of the transistor Mx is connected with the node e. The gate terminal of the transistor Mx is connected with the node c. The first drain/source terminal of the transistor My is connected with the node c. The second drain/source terminal of the transistor My is connected with the node e. The gate terminal of the transistor My is connected with the node b. The resistor Rx is connected between the node b and the node e. The resistor Ry is connected between the node c and the node e. Since the latching circuit 710 is additionally equipped with the resistors Rx and Ry, the high voltage level and the low voltage level can be adjusted, and the operating speed of the latching circuit 710 can be increased.

As shown in FIG. 7B, the latching circuit 720 comprises two NOT gates 722 and 724. The NOT gates 722 and 724 receive the first supply voltage Vdd and the second supply voltage Vss. The input terminal of the NOT gate 722 is connected with the node b. The output terminal of the NOT gate 722 is connected with the node c. The input terminal of the NOT gate 724 is connected with the node c. The output terminal of the NOT gate 724 is connected with the node b. Consequently, the voltage at the node b is the first output signal Out1, and the voltage at the node c is the second output signal Out2.

In the above embodiment, the combinational logic circuit 410 comprises the NOT gate 412, the delay element 416 and the OR gate. The components of the combinational logic circuit are not restricted as long as the combinational logic circuit is capable of generating the signals with the signal sequence identical to that of the technology of the present invention.

From the above descriptions, the relaxation oscillator of the present invention is equipped with the combinational logic circuit. Due to the combinational logic circuit, the relaxation oscillator can be started up successfully. Consequently, during the start-up period of the relaxation oscillator, the generation of the deadlock situation can be avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A relaxation oscillator, comprising:
   a voltage-controlled current circuit receiving a first supply voltage, and comprising a first current path, a second current path, a third current path and a fourth current path, wherein the first current path is coupled to a first node, the second current path is coupled to a second node, the third current path is coupled to a third node, the fourth current path is coupled to a fourth node, and a voltage at the second node is a first output signal of the relaxation oscillator;
   a first transistor, wherein a first drain/source terminal of the first transistor is connected with the second node, a second drain/source terminal of the first transistor is connected with a fifth node, and a gate terminal of the first transistor is connected with the first node;
   a second transistor, wherein a first drain/source terminal of the second transistor is connected with the third node, a second drain/source terminal of the second transistor is connected with the fifth node, and a gate terminal of the second transistor is connected with the fourth node;
   a third transistor, wherein a first drain/source terminal of the third transistor is connected with the first node, a second drain/source terminal of the third transistor is connected with the fifth node, and a gate terminal of the third transistor is connected with the third node;
   a fourth transistor, wherein a first drain/source terminal of the fourth transistor is connected with the fourth node, a second drain/source terminal of the fourth transistor is connected with the fifth node, and a gate terminal of the fourth transistor is connected with the second node;
   a first capacitor connected between the first node and the fifth node;
   a second capacitor connected between the fourth node and the fifth node, wherein the fifth node receives a second supply voltage;
   a latching circuit wherein a first terminal of the latching circuit is connected with the second node, a second terminal of the latching circuit is connected with the third node, and a third terminal of the latching circuit is connected with the fifth node;
   a combinational logic circuit receiving a control signal, and generating a first signal and a second signal;
   a fifth transistor, wherein a first drain/source terminal of the fifth transistor is connected with the second node, a second drain/source terminal of the fifth transistor is connected with the fifth node, and a gate terminal of the fifth transistor receives the second signal;
   a sixth transistor, wherein a first drain/source terminal of the sixth transistor is connected with the third node, a second drain/source terminal of the sixth transistor is connected with the fifth node, and a gate terminal of the sixth transistor receives the first signal;
   a seventh transistor, wherein a first drain/source terminal of the seventh transistor is connected with the first node, a second drain/source terminal of the seventh transistor is connected with the fifth node, and a gate terminal of the seventh transistor receives the second signal; and
   an eighth transistor, wherein a first drain/source terminal of the eighth transistor is connected with the fourth node, a second drain/source terminal of the eighth transistor is connected with the fifth node, and a gate terminal of the eighth transistor receives the second signal,
   wherein when the control signal is inactivated, the relaxation oscillator is not in a normal working mode, wherein when the control signal is activated, the relaxation oscillator is in the normal working mode.

2. The relaxation oscillator as claimed in claim 1, wherein a voltage at the third node is a second output signal of the relaxation oscillator.

3. The relaxation oscillator as claimed in claim 1, wherein the combinational logic circuit comprises:
   a NOT gate, wherein an input terminal of the NOT gate receives the control signal, and an output terminal of the NOT gate generates the first signal;
   a delay element, wherein an input terminal of the delay element is connected with the output terminal of the NOT gate; and
   an OR gate, wherein a first input the terminal of the OR gate is connected with an output terminal of the delay element, a second input terminal of the OR gate is connected with the output terminal of the OR gate, and an output terminal of the OR gate generates the second signal.

4. The relaxation oscillator as claimed in claim 1, wherein when the control signal is activated, the sixth transistor is turned off, and the fifth transistor, the seventh transistor and the eighth transistor are turned on, wherein after the control signal has been activated for a delay time, the fifth transistor, the sixth transistor, the seventh transistor and the eighth transistor are turned off, so that the relaxation oscillator is in the normal working mode, wherein when the control signal is inactivated, the fifth transistor, the sixth transistor, the seventh transistor and the eighth transistor are turned on, so that the relaxation oscillator is disabled.

5. The relaxation oscillator as claimed in claim 1, wherein the first current path of the voltage-controlled current circuit is directly connected with the first node, the second current path of the voltage-controlled current circuit is directly connected with the second node, the third current path of the voltage-controlled current circuit is directly connected with the third node, and the fourth current path of the voltage-controlled current circuit is directly connected with the fourth node.

6. The relaxation oscillator as claimed in claim 1, wherein the relaxation oscillator further comprises:
   a ninth transistor, wherein a first drain/source terminal of the ninth transistor is connected with the second current path, a second drain/source terminal of the ninth transistor is connected with the second node, and a gate terminal of the ninth transistor receives the second signal;
   a tenth transistor, wherein a first drain/source terminal of the tenth transistor is connected with the third current path, a second drain/source terminal of the tenth transistor is connected with the third node, and a gate terminal of the tenth transistor receives the first signal;
   an eleventh transistor, wherein a first drain/source terminal of the eleventh transistor is connected with the first current path, a second drain/source terminal of the eleventh transistor is connected with the first node, and a gate terminal of the tenth transistor receives the second signal; and
   a twelfth transistor, wherein a first drain/source terminal of the twelfth transistor is connected with the fourth transistor, a second drain/source terminal of the twelfth transistor is connected with the fourth node, and a gate terminal of the twelfth transistor receives the second signal.

7. The relaxation oscillator as claimed in claim 6, wherein when the control signal is activated, the tenth transistor is turned on, and the ninth transistor, the eleventh transistor and the twelfth transistor are turned off, wherein after the control signal has been activated for a delay time, the ninth transistor, the tenth transistor, the eleventh transistor and the twelfth transistor are turned on, wherein when the control signal is inactivated, the ninth transistor, the tenth transistor, the eleventh transistor and the twelfth transistor are turned off.

8. The relaxation oscillator as claimed in claim 1, wherein the voltage-controlled current circuit comprises:
   a ninth transistor, wherein a first drain/source terminal of the ninth transistor receives the first supply voltage, a second drain/source terminal of the ninth transistor is the first current path, and a gate terminal of the ninth transistor receives a bias voltage;
   a tenth transistor, wherein a first drain/source terminal of the tenth transistor receives the first supply voltage, a second drain/source terminal of the tenth transistor is the second current path, and a gate terminal of the tenth transistor receives the bias voltage;
   an eleventh transistor, wherein a first drain/source terminal of the eleventh transistor receives the first supply voltage, a second drain/source terminal of the eleventh transistor is the third current path, and a gate terminal of the tenth transistor receives the bias voltage; and
   a twelfth transistor, wherein a first drain/source terminal of the twelfth transistor receives the first supply voltage, a second drain/source terminal of the twelfth transistor is the fourth current path, and a gate terminal of the twelfth transistor receives the bias voltage.

9. The relaxation oscillator as claimed in claim 1, wherein the voltage-controlled current circuit comprises:
   a ninth transistor, wherein a first drain/source terminal of the ninth transistor receives the first supply voltage, and a gate terminal of the ninth transistor receives a first bias voltage;
   a tenth transistor, wherein a first drain/source terminal of the tenth transistor receives the first supply voltage, and a gate terminal of the tenth transistor receives the first bias voltage;
   an eleventh transistor, wherein a first drain/source terminal of the eleventh transistor receives the first supply voltage, and a gate terminal of the eleventh transistor receives the first bias voltage;
   a twelfth transistor, wherein a first drain/source terminal of the twelfth transistor receives the first supply voltage, and a gate terminal of the twelfth transistor receives the first bias voltage;
   a thirteenth transistor, wherein a first drain/source terminal of the thirteenth transistor is connected with a second drain/source terminal of the ninth transistor, a second drain/source terminal of the thirteenth transistor is the first current path, and a gate terminal of the thirteenth transistor receives a second bias voltage;
   a fourteenth transistor, wherein a first drain/source terminal of the fourteenth transistor is connected with a second drain/source terminal of the tenth transistor, a second drain/source terminal of the fourteenth transistor is the second current path, and a gate terminal of the fourteenth transistor receives the second bias voltage;
   a fifteenth transistor, wherein a first drain/source terminal of the fifteenth transistor is connected with a second drain/source terminal of the eleventh transistor, a second drain/source terminal of the fifteenth transistor is the third current path, and a gate terminal of the fifteenth transistor receives the second bias voltage; and
   a sixteenth transistor, wherein a first drain/source terminal of the sixteenth transistor is connected with a second drain/source terminal of the twelfth transistor, a second drain/source terminal of the sixteenth transistor is the fourth current path, and a gate terminal of the sixteenth transistor receives the second bias voltage.

10. The relaxation oscillator as claimed in claim 1, wherein the latching circuit comprises:
    a ninth transistor, wherein a first drain/source terminal of the ninth transistor is connected with the second node, a second drain/source terminal of the ninth transistor is connected with the fifth node, and a gate terminal of the ninth transistor is connected with the third node; and
    a tenth transistor, wherein a first drain/source terminal of the tenth transistor is connected with the third node, a second drain/source terminal of the tenth transistor is connected with the fifth node, and a gate terminal of the tenth transistor is connected with the second node.

11. The relaxation oscillator as claimed in claim 10, wherein the latching circuit further comprises:
    a first resistor connected between the second node and the fifth node; and
    a second resistor connected between the third node and the fifth node.

12. The relaxation oscillator as claimed in claim 1, wherein the latching circuit further comprises:
    a first NOT gate, wherein the first NOT gate receives the first supply voltage and the second supply voltage, an input terminal of the first NOT gate is connected with the second node, and an output terminal of the first NOT gate is connected with the third node; and
    a second NOT gate, wherein the second NOT gate receives the first supply voltage and the second supply voltage, an input terminal of the second NOT gate is connected with the third node, and an output terminal of the second NOT gate is connected with the second node.

* * * * *